(12) United States Patent
Binnard (10) Patent No.: US 6,452,292 B1
(45) Date of Patent: Sep. 17, 2002

(54) PLANAR MOTOR WITH LINEAR COIL ARRAYS

(75) Inventor: Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/603,845

(22) Filed: Jun. 26, 2000

(51) Int. Cl.$^7$ .............................. H02K 41/00; H02K 3/00
(52) U.S. Cl. ......................... 310/12; 310/180; 310/181; 414/935
(58) Field of Search .............................. 310/12, 13, 14, 310/15, 179, 180, 184, 181; 108/137, 138; 414/935, 936; 198/619

(56) References Cited

U.S. PATENT DOCUMENTS

| | | |
|---|---|---|
| RE27,289 E | 2/1972 | Sawyer |
| 3,656,014 A | 4/1972 | Rich |
| RE27,436 E | 7/1972 | Sawyer |
| 3,851,196 A | 11/1974 | Hinds |
| 3,857,078 A | 12/1974 | Sawyer |
| 3,878,411 A | 4/1975 | Nocito et al. |
| 3,935,909 A | 2/1976 | Mabuchi et al. |
| 3,940,676 A | 2/1976 | Dudley |
| 3,942,054 A | 3/1976 | Kirsten et al. |
| 3,958,138 A | 5/1976 | Eastham et al. |
| 4,049,983 A | 9/1977 | Attwood et al. |
| 4,130,769 A | 12/1978 | Karube |
| 4,143,289 A | 3/1979 | Williams |
| 4,151,447 A | 4/1979 | von der Heide et al. |
| 4,317,072 A | 2/1982 | Goof et al. |
| 4,336,475 A | 6/1982 | Morinaga et al. |
| 4,369,383 A | 1/1983 | Langley |
| 4,385,248 A | 5/1983 | Laskaris |
| 4,393,344 A | 7/1983 | Whellams |
| 4,445,061 A | 4/1984 | Jackson |
| 4,463,276 A | 7/1984 | Nakamura |
| 4,485,339 A | 11/1984 | Trost |
| 4,535,278 A | 8/1985 | Asakawa |
| 4,547,713 A | 10/1985 | Langley et al. |
| 4,551,645 A | 11/1985 | Takahahi et al. |
| 4,555,650 A | 11/1985 | Asakawa |
| 4,563,808 A | 1/1986 | Lender |

(List continued on next page.)

FOREIGN PATENT DOCUMENTS

| | | | |
|---|---|---|---|
| JP | 62-100161 | 5/1987 | |
| JP | 2-168846 | 6/1990 | |
| JP | 3-178747 | 8/1991 | |
| JP | 4-125055 | 4/1992 | |
| JP | 7-060581 | 3/1995 | |
| JP | 7-131966 | 5/1995 | |
| WO | WO 98/49763 | 11/1998 | ............ H02K/1/00 |

OTHER PUBLICATIONS

Holmes, et al., "A Long–Range Scanning Stage Design (The LORS Project)," 1996 Proceedings, vol. 14, American Society for Precision Engineering, pp. 322–327, (month unknown).

(List continued on next page.)

Primary Examiner—Burton S. Mullins
(74) Attorney, Agent, or Firm—Finnegan Henderson Farabow Garrett & Dunner, L.L.P.

(57) ABSTRACT

A planar electric motor comprising a magnet array having a plurality of magnets with magnetic fields of alternating polarity and a coil array positioned adjacent to the magnet array and operable to interact with said magnetic fields to generate an electromagnetic force between the coil array and the magnet array. The coil array includes a first linear coil array having a plurality of polygonal shaped coils extending longitudinally in a first direction, and a second linear coil array having a plurality of oval shaped coils extending longitudinally in a second direction generally orthogonal to said first direction. The motor is for use in moving a stage within an exposure apparatus having an optical system for imaging a pattern formed in a reticle onto an article supported by the stage.

41 Claims, 10 Drawing Sheets

U.S. PATENT DOCUMENTS

| | | |
|---|---|---|
| 4,607,167 A | 8/1986 | Petric |
| 4,626,749 A | 12/1986 | Asakawa |
| 4,645,961 A | 2/1987 | Malsky |
| 4,654,571 A | 3/1987 | Hinds |
| 4,667,123 A | 5/1987 | Denk et al. |
| 4,692,631 A | 9/1987 | Dahl |
| 4,705,956 A | 11/1987 | Ward |
| 4,706,007 A | 11/1987 | Nagasaka |
| 4,714,851 A | 12/1987 | Bertram |
| 4,733,118 A | 3/1988 | Mihalko |
| 4,734,603 A | 3/1988 | von der Heide et al. |
| 4,742,286 A | 5/1988 | Phillips |
| 4,758,750 A | 7/1988 | Itagaki et al. |
| 4,767,954 A | 8/1988 | Phillips |
| 4,786,832 A | 11/1988 | Nakagawa et al. |
| 4,794,284 A | 12/1988 | Buon |
| 4,912,746 A | 3/1990 | Oishi |
| 4,937,485 A | 6/1990 | Mihalko |
| 4,952,858 A | 8/1990 | Galburt |
| 4,958,115 A | 9/1990 | Miller |
| 5,015,622 A | 5/1991 | Ward et al. |
| 5,083,905 A | 1/1992 | Mohn |
| 5,126,648 A | 6/1992 | Jacobs |
| 5,179,305 A | 1/1993 | Van Engelen |
| 5,189,268 A | 2/1993 | Pavoz et al. |
| 5,196,745 A | 3/1993 | Trumper |
| 5,208,497 A | 5/1993 | Ishii et al. |
| 5,294,854 A | 3/1994 | Trumper |
| 5,309,049 A | 5/1994 | Kawada et al. |
| 5,319,336 A | 6/1994 | Alcon |
| 5,327,060 A | 7/1994 | Van Engelen |
| 5,334,892 A * | 8/1994 | Chitayat ..................... 310/12 |
| 5,352,946 A | 10/1994 | Hoffman et al. |
| 5,357,158 A | 10/1994 | Takei |
| 5,360,470 A | 11/1994 | Ono et al. |
| 5,399,930 A | 3/1995 | Culp |
| 5,416,396 A | 5/1995 | Takei |
| 5,477,304 A | 12/1995 | Nishi |
| 5,504,407 A | 4/1996 | Wakui et al. |
| 5,519,266 A | 5/1996 | Chitayat |
| 5,528,118 A | 6/1996 | Lee |
| 5,574,556 A | 11/1996 | Mori et al. |
| 5,623,853 A | 4/1997 | Novak et al. |
| 5,666,038 A | 9/1997 | Ohishi |
| 5,715,037 A | 2/1998 | Saiki et al. |
| 5,723,929 A | 3/1998 | Niimi |
| 5,773,837 A | 6/1998 | Nakasuji |
| 5,886,432 A * | 3/1999 | Markle ..................... 310/12 |
| 5,925,956 A | 7/1999 | Ohzeki |
| 6,097,114 A | 8/2000 | Hazelton |
| 6,188,147 B1 * | 2/2001 | Hazelton et al. .............. 310/12 |

OTHER PUBLICATIONS

Ofori–Tenkorang et al., "A Comparative Analysis of Torque Production in Halbach and Conventional Surface–Mounted Permanent–Magent Synchronous Motors," 1995 IEEE, pp. 657–663, (month unknown).

Williams et al., "Magnetic Bearing Stage for Photolithography," Annals of the CIRP, vol. 42/1993, pp. 607–610, (month unknown).

Tomita et al., "Study on a Surface–Motor Drive Precise Positioning System", Journal of Dynamic Systems, Measurement, and Control, Sep. 1995, vol. 117, pp. 311–319.

Trumper et al., "Control and Actuator Design For a Precision Magnetic Suspension Linear Bearing," SPIE, vol. 1696 Controls for Optical Systems (1992), pp. 2–15, (month unknown).

Trumper et al., "Design and Analysis Framework for Linear Permanent Magnet Machines" (1994) *IEEE*, pp. 216–223.

Trumber et al., "Magnet Aarrays for Synchronous Machines", (1993),*IEEE*, pp. 9–18.

* cited by examiner

PLANAR MOTOR WITH LINEAR COIL ARRAYS

FIELD OF THE INVENTION

This invention relates generally to electric motors, and more particularly, to high precision motors for use in lithography systems.

BACKGROUND OF THE INVENTION

Many precision systems, such as those used in semiconductor manufacturing, use linear or planar motors for positioning objects such as semiconductor wafers. Conventional planar motors are disclosed in U.S. Pat. Nos. 3,851,196, 4,654,571, 5,196,745, and 5,334,892. These patents describe planar motors which have significant limitations. For example, the planar motor of the '196 patent has a limited range of motion since each motor portion of the stationary magnet array can only generate force in a single direction. Thus, each coil array must always be located above the corresponding magnet array. This limits the range of movement for a given size actuator. The motor disclosed in the '745 patent similarly requires that each coil array is located above a corresponding linear magnet array. The motor of the '571 patent includes a coil design which generates only a limited amount of force due to the layout of the coils on the stage. In addition, the design does not generate force in six degrees of freedom. The '892 patent discloses a planar motor which permits a wide range of motion, but only in a single plane.

Conventional technology also relies upon cumbersome stacked arrangements to achieve six degrees of freedom of movement. These stacked arrangements have a number of drawbacks including additional power requirements, and reduced positioning accuracy. Motors which eliminate stacked arrangements and provide six degrees of freedom over a full range of movement of the wafer stage with a single planar motor typically require large magnet and coil arrays to provide the force required. This results in an increase in mass of the stage and system, thus reducing the natural frequency of the system and degrading performance.

Furthermore, conventional systems often include complex coil geometry which increases the size of the motor and increases the stage mass, thus increasing power requirements. The complex geometry of the coils often prevents close packing of the coils, which further increases the size of the motor. The coil arrays also require a large number of individual coils and amplifiers and complex control electronics to energize the coils and drive the motor.

There is, therefore, a need for a compact motor with a non-complex coil array having closely packed coils, which provides six degrees of freedom with high speed and precision and energy efficient operation.

SUMMARY OF THE INVENTION

The present invention overcomes the deficiencies of the prior art by providing a compact motor with a simplified coil geometry which provides six degrees of freedom and energy efficient operation.

The present invention is directed to a planar motor comprising a magnet array having a plurality of magnets with magnetic fields of alternating polarity and a coil array positioned adjacent to the magnet array and operable to interact with the magnetic fields to generate an electromagnetic force between the coil array and the magnet array. The coil array comprises a first linear coil array having a plurality of polygonal shaped coils extending longitudinally in a first direction, and a second linear coil array having a plurality of oval shaped coils extending longitudinally in a second direction generally orthogonal to the first direction.

The oval shaped coils preferably have a length greater than the length of the polygonal shaped coils and have substantially planar upper and lower surfaces.

The magnets may have a rectangular or octagonal cross-sectional shape, for example. The magnets may be arranged in a checkerboard pattern with alternating magnetic poles along a row or column, or the magnets in one row may have the same polarity with magnets in an adjacent row having oppositely directed polarity, for example. The magnets may be closely packed or spaced from one another.

An exposure apparatus of the present invention generally comprises a frame, an optical system mounted on the frame for imaging a pattern formed in a reticle onto an article, and a base disposed below the optical system. A stage for supporting and positioning the article is positioned adjacent to the base. The apparatus further comprises an electric motor operable to move the stage. The motor comprises a magnet array having a plurality of magnets with magnetic fields of alternating polarity, and a coil array positioned adjacent to the magnet array and operable to interact with the magnetic fields to generate an electromagnetic force between the coil array and the magnet array. The coil array includes a first linear coil array having a plurality of polygonal shaped coils extending longitudinally in a first direction, and a second linear coil array having a plurality of oval shaped coils extending longitudinally in a second direction generally orthogonal to said first direction. One of the coil array and the magnet array is connected to the stage for movement therewith relative to the other of the magnet array and the coil array which is connected to the base.

A stage positioning system of the present invention generally comprises a stage movable relative to a stationary base in a first direction and a second direction generally orthogonal to the first direction, and an electric motor operable to move the stage. The motor comprises a magnet array having a plurality of magnets with magnetic fields of alternating polarity, and a coil array positioned adjacent to the magnet array and operable to interact with the magnetic fields to generate an electromagnetic force between the coil array and the magnet array. The coil array includes a first linear coil array having a plurality of coils extending longitudinally in the first direction, and a second linear coil array having a plurality of coils extending longitudinally in the second direction. Each of the coils of the second linear coil array has a length greater than a length of the stage in the second direction. One of the coil array and the magnet array is connected to the stage for movement therewith relative to the other of the magnet array and the coil array which is connected to the base.

The above is a brief description of some deficiencies in the prior art and advantages of the present invention. Other features, advantages, and embodiments of the invention will be apparent to those skilled in the art from the following description, drawings, and claims.

BRIEF DESCRIPTION OF THE DRAWINGS

FIG. 3b is a graphical representation of an electromagnetic force component of the electric motor of FIG. 3a;

FIG. 4a is a schematic of the electric motor of FIG. 3a with the coil array moved relative to the magnet array from its position in FIG. 3a;

FIG. 4b is a graphical representation of an electromagnetic force component of the electric motor of FIG. 4a;

FIG. 6b is side view of the coil of FIG. 6a;

Corresponding reference characters indicate corresponding parts throughout the several views of the drawings.

DESCRIPTION OF THE INVENTION

Figure 1:
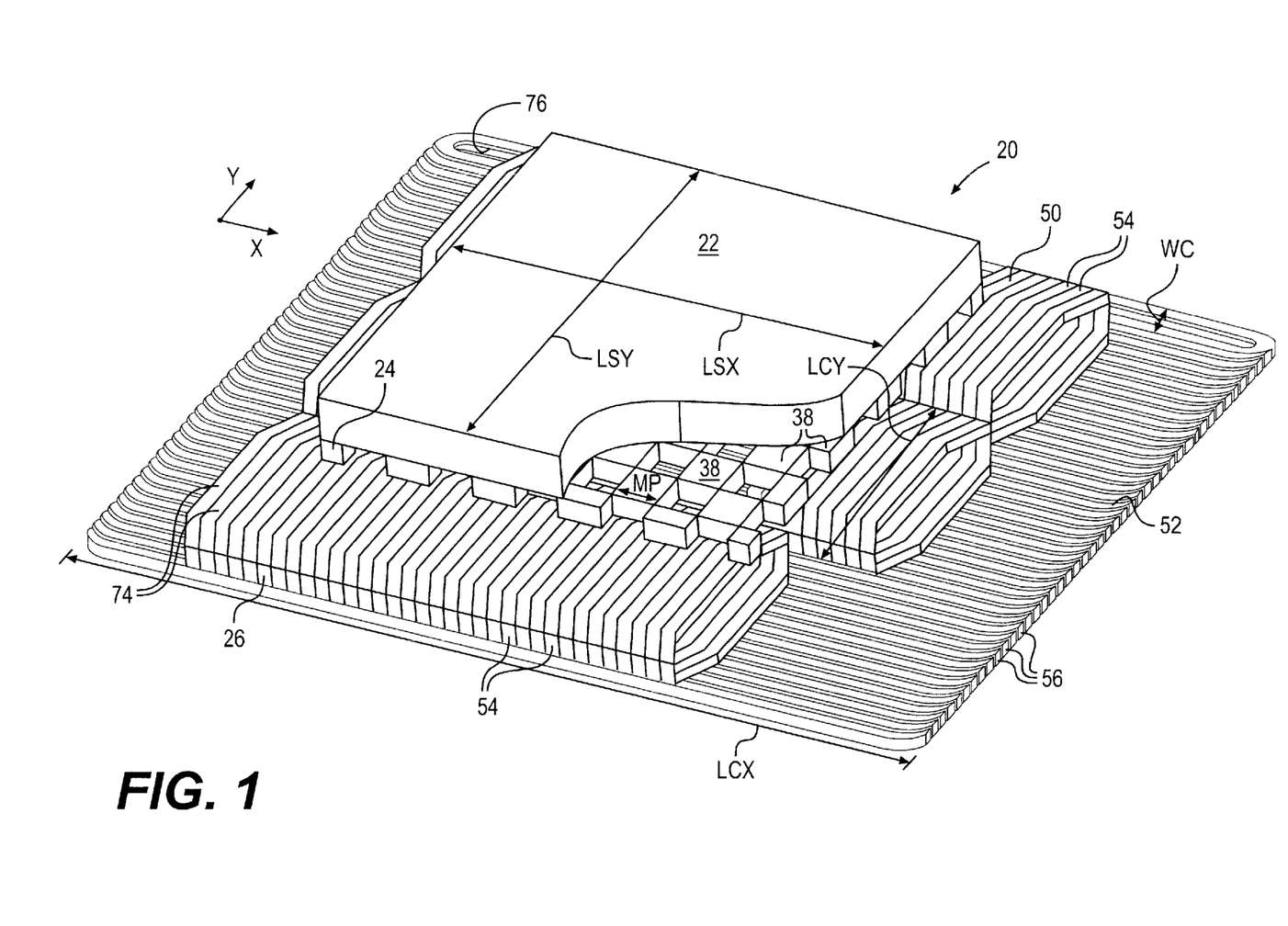
FIG. 1 is a perspective of an electric motor of the present invention with a magnet array of the motor attached to a stage.
Figure 2:
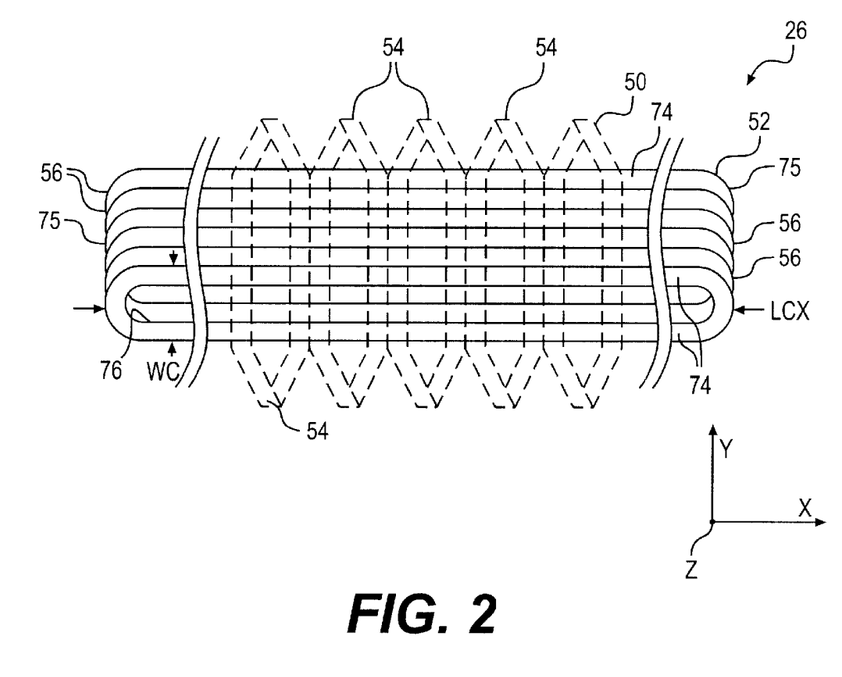
FIG. 2 is a plan view of a coil array of the present invention.

Referring now to the drawings, and first to FIG. 1, an electric motor of the present invention, generally indicated at 20, is shown with a stage 22 attached to the motor for positioning a semiconductor wafer (not shown) during a photolithography process. The electric motor 20 may also be used to position a reticle during semiconductor processing or in other types of positioning systems for processing articles other than semiconductor wafers. The electric motor 20 is a planar motor comprising a magnet array 24 and a coil array, generally indicated at 26 (FIGS. 1 and 2). The motor 20 uses electromagnetic force (Lorentz force) to propel the stage 22. The magnet array 24 is positioned adjacent to the coil array 26 and provides permanent magnetic fields which interact with a current distribution of the coil array to cause a force between the magnet array and the coil array. The interaction of the magnetic fields and the current distribution permits either the magnet array 24 or the coil array 26 to move with respect to the other in at least three degrees of freedom and preferably six degrees of freedom. For example, currents in the coil array 26 may interact with magnetic fields from the magnet array 24 to cause a force in the x, y, and z directions, and torque about the x, y, and z axes. This interaction, and the general operation of a planar motor is described in U.S. Pat. application Ser. No. 09/192,813, by A. Hazelton et al., filed Nov. 16, 1998 and Ser. No. 09/135,624, by A. Hazelton, filed Aug. 17, 1998, the entirety of which are incorporated herein by reference.

As shown in FIG. 1, the magnet array 24 is attached to the stage 22 and is free to move with the stage relative to the coil array 26 which is in a stationary position. This moving magnet embodiment is preferred over a moving coil arrangement when used in positioning devices, because the magnet array 24 does not require electrical current connections. In addition, when coil cooling is required, cooling hoses (not shown) must be attached to the coil array 26. The electrical connections and cooling hoses may interfere with movement of the coil array 26. However, the coil array 26 may be attached to the stage 22 and movable relative to a fixed magnet array for other applications.

Figure 3A:
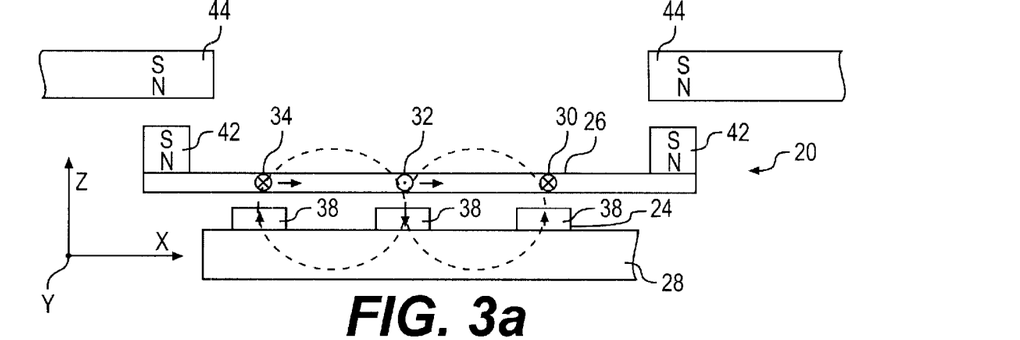
FIG. 3a is a schematic of an electric motor of the present invention showing the interaction of the magnet array and the coil array.

Referring now to FIGS. 3a–5, the interaction of the coil array 26 and the magnet array 24 is described, and more specifically commutations of the coil array to provide motion in the x, y, and z directions, torque about the x and y axes, and rotational motion about the z axis are described. FIGS. 3a–5 show a moving coil embodiment of the motor 20, however, the following description is also applicable to the moving magnet embodiment described above. The magnet array 24 includes a plurality of magnets 38 (three shown) mounted on a magnetic plate 28. The magnets 38 alternate in polarity in the z direction. The coil array 26 is shown positioned above the magnet array 24 and is schematically shown as consisting of three wires 30, 32, 34 connected to a single-phase source of electric current. For purposes of clarity, only three coil wires are shown in FIGS. 3a and 4a. As is well known by those skilled in the art, the coil array 26 may include numerous closely packed wires connected with a commutation circuit in multiple phases (e.g., two or three), with each phase having a plurality of wires.

The wires 30, 32, 34 are located directly above the magnets 38 of the magnet array 24. A commutation circuit (not shown) controls and supplies electric current to the wires 30, 32, 34. A solid dot on a wire indicates electric current flowing in the −y direction out of the plane of the drawing and an x on the wire indicates electric current flowing in the +y direction into the plane of the drawing. As shown in FIG. 3a, electric current on the wires 30 and 34 flows into the plane of the drawing and the electric current on the wire 32 flows out of the plane of the drawing. Dashed lines indicate the magnetic flux path of the magnet array 24 and arrows on the magnets 38 indicate the magnetic polarity. According to the Lorentz law, an electromagnetic force acts on the coil array 26 exclusively in the x direction. An equal but oppositely directed electromagnetic force acting on the magnet array 24 balances each electromagnetic force component acting on the coil array 26. As the wires 30, 32, 34 of the coil array 26 move laterally relative to the magnets 38 of the magnet array 24, an electric current distribution Ix eventually drops to zero.

Figure 3B:
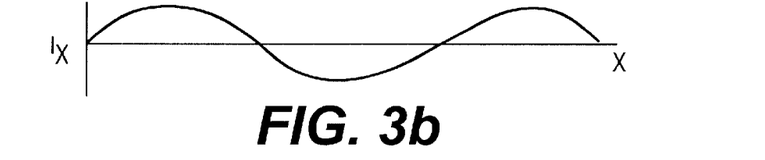

FIG. 3b shows the current distribution Ix as a function of the position of the coil array 26 along the x axis. The electric current Ix is applied to achieve forces and motion of the coil array 26 relative to the magnet array 24 in the x direction. The electric current Ix is typically supplied by the commutation circuit as a sinusoidal waveform, as shown graphically in FIG. 3b in alignment with the planar motor of FIG. 3a.

Figure 4A:
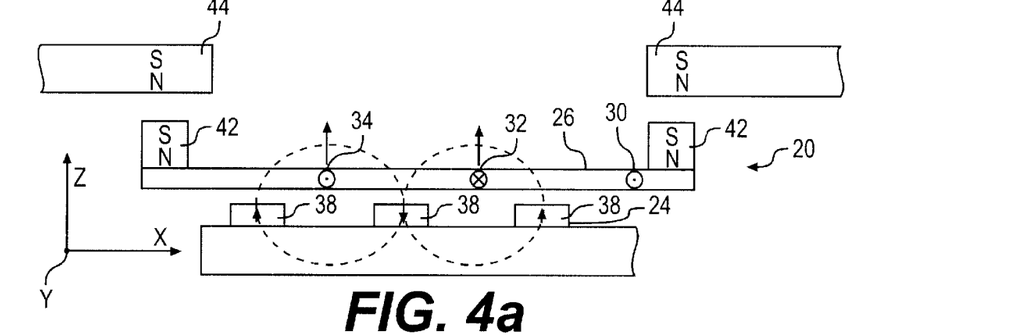
Figure 4B:
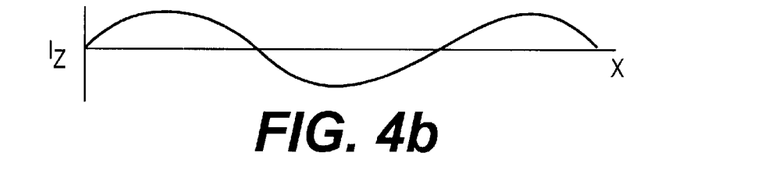

FIG. 4a shows the motor 20 of FIG. 3a at a later point in time after the coil array 26 has been propelled along the x direction a distance equal to approximately half the distance between adjacent wires 32, 34. The wires 32, 34 are now positioned midway between respective magnets 38. The commutation circuit provides electric current flowing in the −y direction out of the plane of the drawing in the wires 30 and 34 and in the +y direction into the plane of the drawing in the wire 32. In accordance with the Lorentz law, the resultant electromagnetic force acts on the coil array 26 exclusively in the z direction. The z direction force acts to urge the coil array 26 upward away from the magnet array 24. The magnitude of the electric current adjusts the altitude of the coil array 26 above the magnet array 24. The angular inclination of the coil array 26 relative to the magnet array 24 may be adjusted by supplying currents of differing magnitudes through different wires. For example, providing a stronger current to the wire 32 than to the wire 34 causes the right hand side (as viewed in FIG. 4a) of the coil array 26 to raise higher relative to the left hand side of the coil array above the magnet array 24. This provides rotation of the coil array 26 about the x and y axes. A sinusoidal shaped waveform, as shown graphically in FIG. 4b in alignment with the planar motor 20 of FIG. 4a, causes electric current Iz to fall eventually to zero when the wires 30, 32, 34 move farther to the right relative to the respective magnets 38.

As shown on the wire 34 in FIGS. 3a and 4a, the Lorentz force has an z component which urges the coil array 26 away from the magnet array 24, and an x component, which urges the coil array in the x direction. When only x force is desired, the z direction force components are cancelled by an opposing z force component on a wire commutated by a different phase and having either a magnetic flux or current reversed relative to the wire 34, so that only the x direction force remains.

Levitation magnets 42, 44 may be used to help suspend the coil array 26 (FIG. 4a) (or magnet array 24). The magnets 42, 44 may also be used to augment z force commutation as a means for suspending the stage 22, thus reducing the electric current needed to generate z direction force for suspension of the stage.

Figure 5:
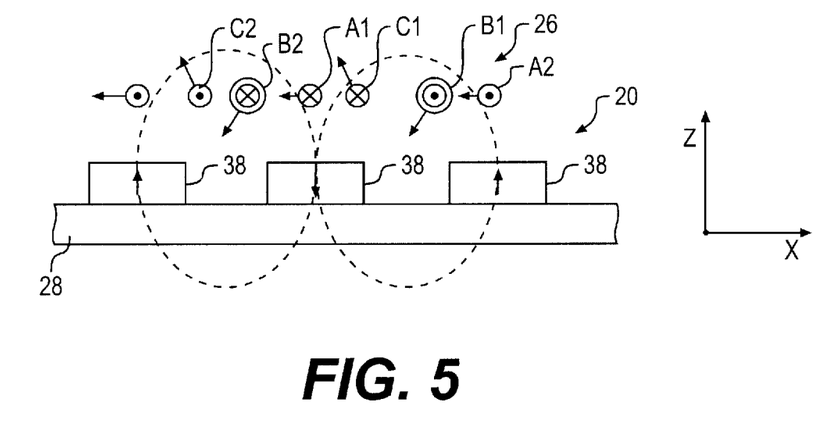
FIG. 5 is a schematic of an electric motor of the present invention illustrating three-phase commutation.

FIG. 5 shows the motor 20 with the coil array 26 having six wires A1, A2, B1, B2, C1, and C2 distributed among three phases A, B, and C with two wires per phase. The polarity of each of the magnets 38 is shown by arrows within each magnet and the magnetic flux path of the magnet array 24 is indicated by dashed lines. Paired wires of the same phase have oppositely directed current, since they are portions of a single continuous current loop. Wires A1, B1, and C1 therefore have oppositely directed current from wires A2, B2, and C2, respectively. In accordance with the Lorentz law, the electromagnetic force on wires A1, A2, B1, B2, C1, and C2 acts in the direction shown by the arrows pointing from the respective wires. Forces on the wires A1, A2 of phase A act exclusively in the x direction. The wires B1, C1, B2, C2 of the B and C phases all have z components of the electromagnetic force. The +z force components acting on wires C1 and C2 of phase C are identically cancelled by the −z force components acting on wires B1 and B2 of phase B, leaving only net x force components on the coil array 26. In other commutation configurations, x force components are identically canceled between phases, leaving only net z force components.

A few examples of commutation have been described. As will be appreciated by those skilled in the art, many other commutations may be applied to the coils to achieve force and motion in the x, y, and z directions, torque about the z axis and rotation about the x and y axes. Clearly, other portions of the coil array may be similarly commutated by currents and current distributions as illustrated in FIGS. 3a–5 to produce differing magnitudes of x and z forces on different portions of the electric motor 20. Since these various portions of the motor 20 are separated by distances in the x and y directions, rotational force about the x, y, and z directions and linear force in the x and z directions can be produced. An identical analysis of forces acting upon coils distributed in the y direction provides rotational force about the x direction and linear force in the y and z directions. Thus, six degrees of freedom of motion for the electric motor 20 is achieved.

As shown in FIG. 2, the coil array comprises an x linear coil array (x-coil array) 50 for moving the stage along the x axis and an y linear coil array (y-coil array) 52 for moving the stage along the y axis. In order to provide force to the stage 22 in the x direction relative to the coil array 26, two, three, or multiphase commutated electric current is supplied to the x-coil array 50 in a conventional manner by a commutation circuit and current source (not shown) (FIGS. 1 and 2). In order to provide force to the stage 22 in the y direction, two, three, or multiphase commutated electric current is supplied to the y-coil array 52 by respective commutation circuits and current source. To provide rotation of the stage 22 relative to the coil array 26 in an xy plane parallel to the x and y axes, commutated electric current is supplied individually to coils 54 within the x-coil array 50. Alternatively, electric current may be supplied to all coils 54 of the x coil array 50, but with opposite polarities, providing force to some of the coils in one direction and the other coils in the opposite direction, thereby generating torque about the z axis. The commutation circuits and the current sources are controlled by conventional motor controllers (not shown) providing logic signals for directing movement of the motor 20.

The x-coil array 50 is oriented so that the coils 54 extend longitudinally in a direction perpendicular to the x axis and the y-coil array 52 is oriented so that the coils 56 extend longitudinally in a direction perpendicular to the y axis. In operation, each coil 54, 56 produces a substantially constant force along a respective x or y linear direction. To generate force in the y direction, the coils 56 located directly under the magnet array 24 and the stage 22 are energized. Similarly, to generate force in the x direction, the coils 54 located directly under the magnet array 24 and stage 22 are energized.

Figure 6A:
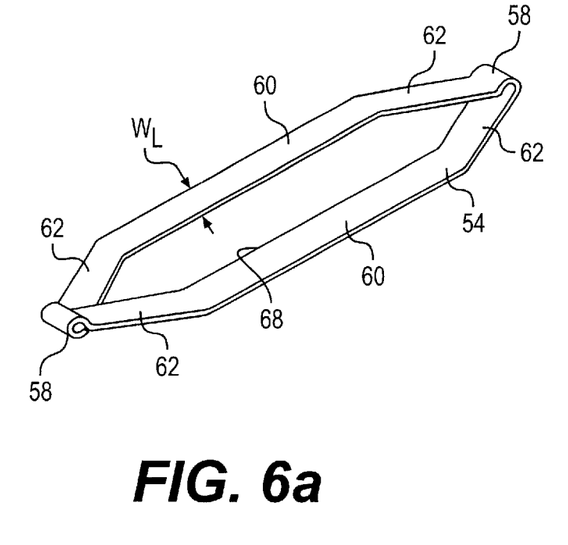
FIG. 6a is a perspective of a coil of the coil array of FIG. 1.
Figure 6B:
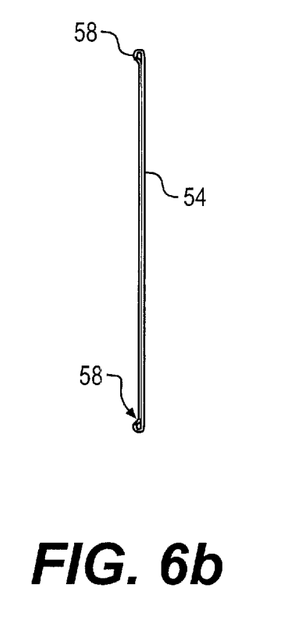

The x-coil array 50 includes a plurality of hexagonal shaped coils 54 (FIGS. 2 and 6a-6b). An apparatus and method for making the coils 54 are described in U.S. Pat. application Ser. No. 09/059,056, filed Apr. 10, 1998, which is incorporated herein by reference in its entirety. Each coil 54 includes two opposing legs, each having a long portion 60 and two short portions 62. The long portions 60 extend generally parallel to one another and are spaced from one another. The short portions 62 each extend at an angle from one of the long portions 60 with the free ends of the short portions converging towards one another to form a bounded central opening 68 (FIG. 6a). The long portions 60 of the legs are preferably spaced apart a distance twice the width $W_L$, of the leg, for a three-phase commutated motor, for example. The coil 54 is formed from a plurality of wires (e.g., 7 or 8) (not shown) positioned immediately adjacent to one another to form the legs of the coil. The wire is preferably copper and has a circular cross-sectional shape. As shown in FIG. 6b, the coil 54 is bent so that the legs of the coil are generally in the same plane. Due to the limited bend radius of the wire, a small bump 58 is formed at each end of the coil 54.

Figure 7:
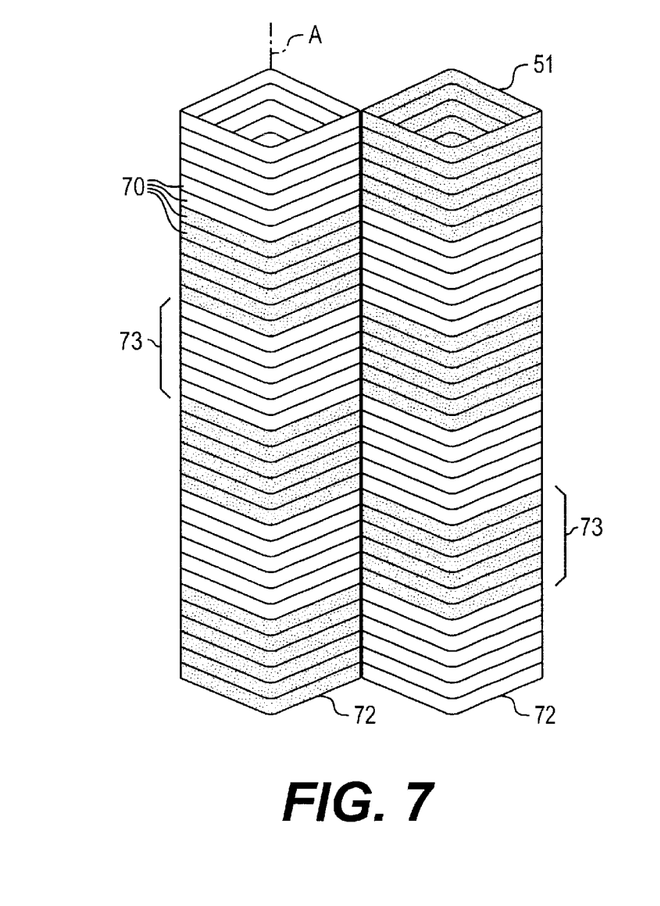
FIG. 7 is a plan view of a row of coils.
Figure 8:
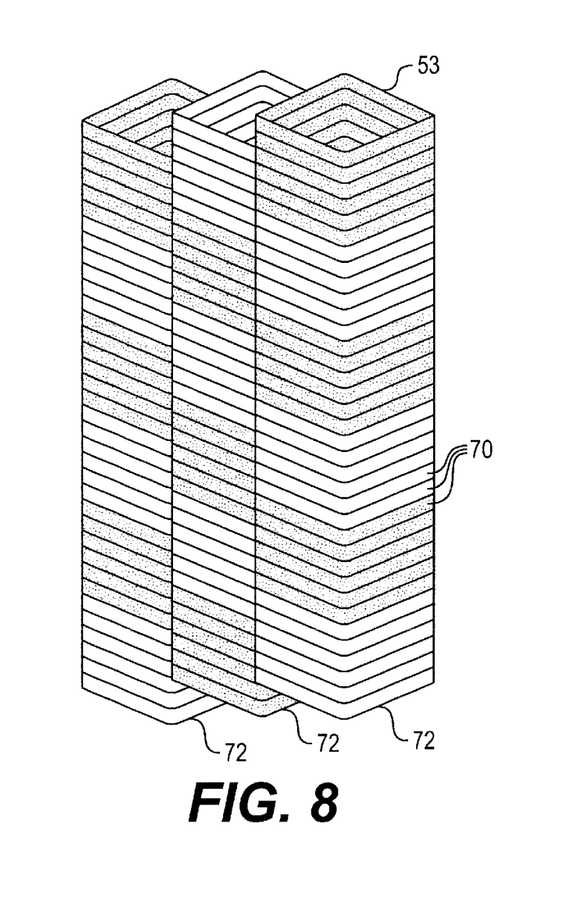
FIG. 8 is a plan view of an alternative arrangement of the rows of coils of FIG. 7.

In addition to the hexagonal shaped coil 54 shown in FIGS. 6a and 6b, other polygonal shapes including diamond, double diamond, and parallelogram may be used. Also, the coils 54 may be oval shaped. FIGS. 7 and 8 show a plurality of diamond shaped coils 70 arranged to form an x-coil array 51, 53. In order to construct the x-coil array 51, 53 a row 72 of partially overlapped coils 70 is first assembled parallel to a longitudinal axis A, as shown in FIG. 7. The row 72 includes six sets 73 of coils 70. Each set 73 includes two coils 70 for each of the three phases. The number of coils 70 in a row 72 may vary, depending on the number of phases of the motor 20 and the choice of coils per phase. Each phase of one row 72 is driven by a separate amplifier of a commutation circuit (not shown). The x-coil arrays 51, 53 each include a plurality of rows 72. FIG. 7 shows one arrangement of rows 72 of the coils 70 arranged side-by-side in a lateral direction non-collinear with the longitudinal axis A to form the x-coil array 51. Preferably rows 72 are arranged side-by-side in a direction generally orthogonal to the longitudinal axis A. FIG. 8 shows another arrangement of the rows 72 in which the rows are overlapped side-by-side to form the laterally partially overlapped x-coil array 53. The row 72 is preferably as long as the required travel of the stage 22 plus the length of the stage.

The y-coil array 52 is formed from a plurality of the coils 56 wound in a generally oval shape (FIG. 2). The coils 56 are formed from a plurality of copper wires having a circular or rectangular cross-sectional shape. The oval coils 56 may also be formed using laminated flex-circuit technology. A laminated flex-circuit is formed by laminating together layers of flexible circuit board. Each layer of the lamination includes an insulating material (preferably polyimide) and a conductive material (preferably copper). The layers may be formed by depositing copper on a polyimide substrate, for example. Each layer includes a single turn of the conductive material or a spiral pattern which contains several turns of the conductive material. A hole is formed in the insulating material to allow electrical connection between adjacent layers. Since the coils 56 do not have sharp bends as with the polygonal shaped coils 54, the coils do not have raised bumps at the end of each coil. The oval coils 56 are therefore generally flat with substantially planar upper and lower surfaces. This allows the coils 56 to be closely packed with no spacing therebetween. Further, since end portions 75 of the oval coils 56 have a shorter length than the short portions 62 (making up the end portions of the coils 56), a greater portion of the length can be used to produce force, thus increasing the efficiency of the motor 20. The oval coil 56 is formed with opposing legs 74 spaced from one another to form a central opening 76.

The length Lcy of the coil 54 is preferably equal to or less than about one half the length Lsy of the stage 22 in the y direction (FIG. 1). The length Lcx of the coil 56 is preferably slightly larger than the stroke of the motor in the x direction plus the length Lsx of the stage in the x direction. Thus, the length Lcx of the coil 56 is preferably at least two times the length Lcy of the coil 54. The width Wc of the coil 56 is preferably about equal to a magnet pitch Mp of the magnet array 24. A smaller number of oval coils 56 is required than the polygonal coils 54 due to the larger length of the oval coils. This allows the overall number of amplifiers for the motor 20 to be reduced from motors with conventional coil arrays.

The y-linear coil array is stacked on top of the x-linear coil array vertically in the z direction (perpendicular to the x and y axes (FIG. 2). It is to be understood that the coil array 26 may be arranged differently than shown herein without departing from the scope of the invention. For example, the x and y coil arrays 50, 52 may be interchanged so that the x-coil array overlays the y-coil array. The x and y coil arrays 50, 52 may be mounted on a magnetically permeable panel formed from a material such as iron. The magnetically permeable panel increases the permanent magnetic flux through the coils 54, 56 and thus improves the motor 20 performance.

Figure 9:
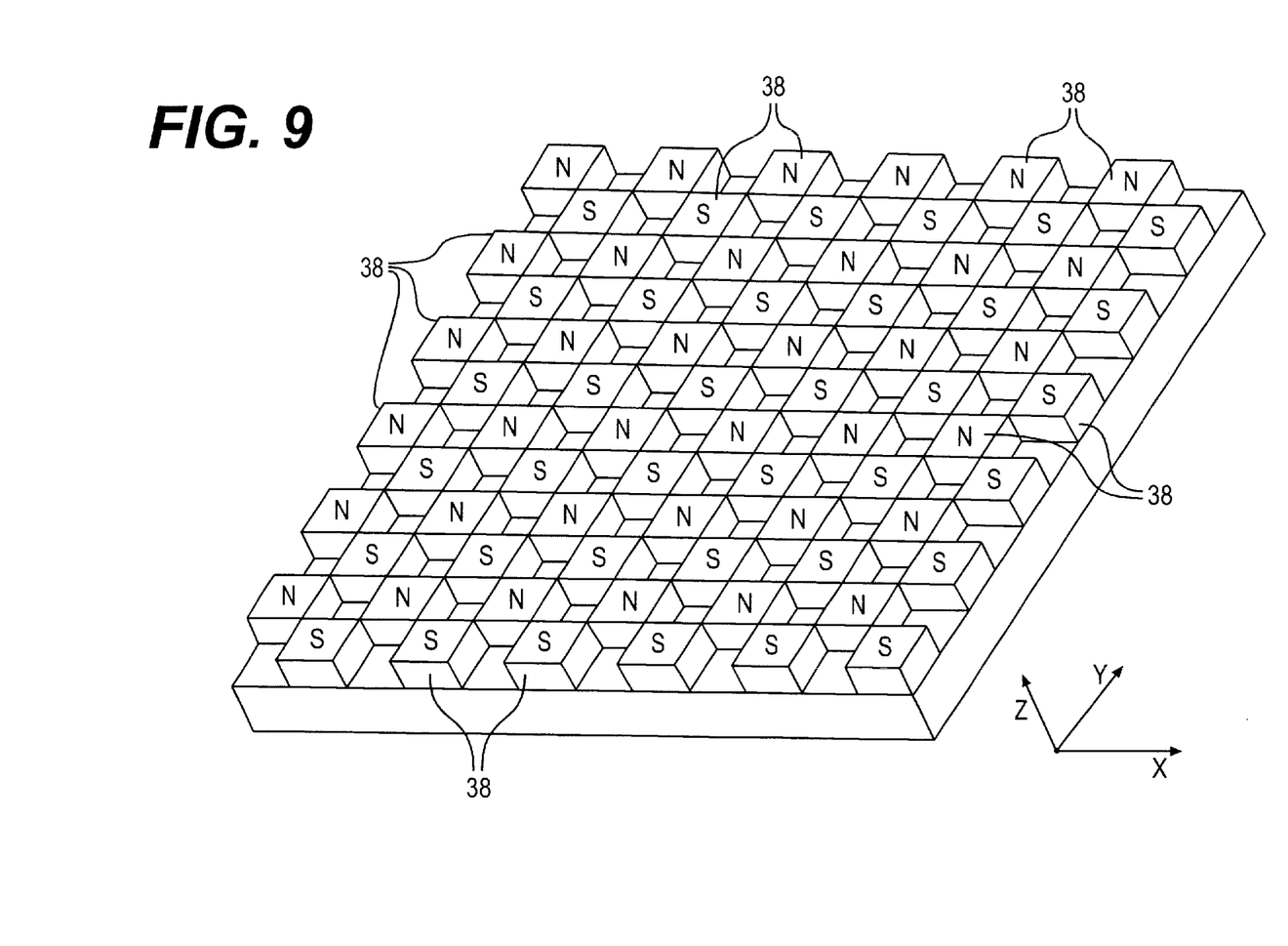
FIG. 9 is a perspective of the magnet array of FIG. 1.

A first embodiment of the magnet array 24 is shown in FIG. 9. The magnet array includes a plurality of the magnets 38 distributed in a first direction along the x-axis and in a second direction along the y-axis to form a two-dimensional magnet array. The magnets 38 are aligned in the two directions along the x and y axes in a staggered checkerboard arrangement. The poles of the magnets 38 are directed along the z axis either into or out of the plane of the drawing (i.e., north or south). The magnets 38 alternate in polarity in rows and columns. For example, one row has all north magnets 38 and the adjacent row has all south magnets. It is to be understood that the arrangement of magnets 38 and types of magnets may be different than shown herein without departing from the scope of the invention. For example, the magnets 38 may be aligned immediately adjacent to one another with no spacing in between and alternate in pole directions along each row or column. If the magnets 38 are disposed immediately adjacent one another, the magnet array is preferably oriented at a 45 degree angle relative to the x and y coils 54, 56.

Figure 10:
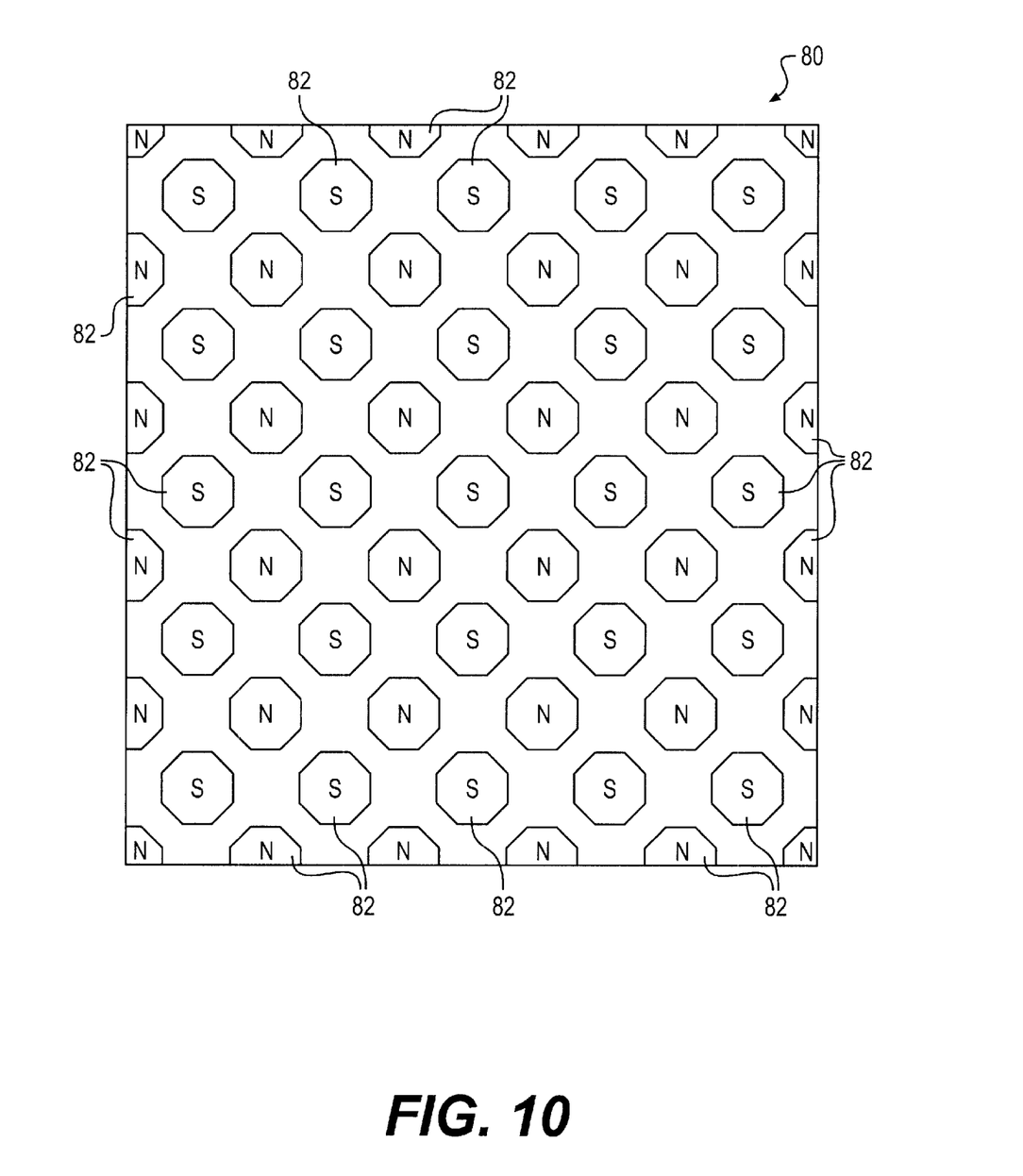
FIG. 10 is a plan view of a second embodiment of the magnet array of FIG. 9.

A second embodiment of the magnet array is shown in FIG. 10 and generally indicated at 80. The magnet array 80 comprises a plurality of octagonal shaped magnets 82 which are distributed in two directions. The magnets 82 are evenly spaced from one another and alternate in polarity between adjacent rows and columns.

Figure 11:
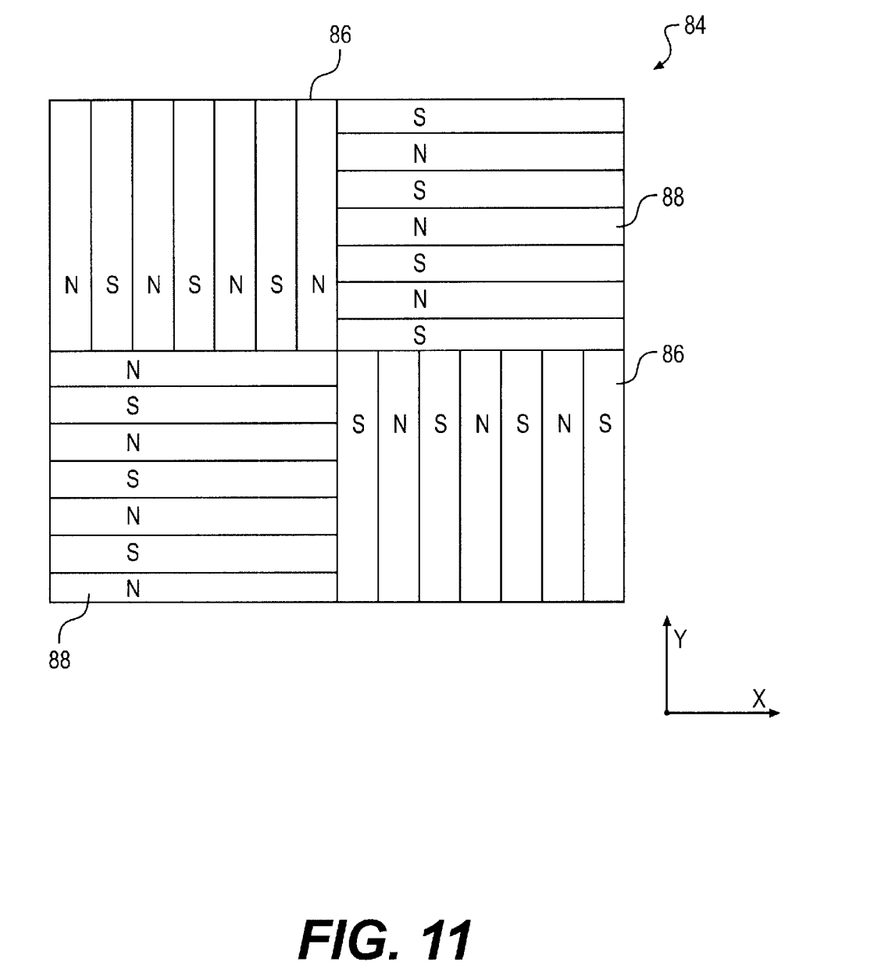
FIG. 11 is a plan view of a third embodiment of the magnet array of FIG. 9.

FIG. 11 shows a third embodiment of the magnet array, generally indicated at 84. The magnet array 84 comprises two linear magnet sets 86 having rectangular magnets aligned parallel to the y axis and two linear magnet sets 88 having rectangular magnets aligned parallel to the x axis (orthogonal to the y axis).

The magnet array may also comprise transverse and wedge magnets as described in U.S. Pat. application Ser. No. 09/168,694, by Hazelton et al., filed Oct. 5, 1998, for example.

Figure 12:
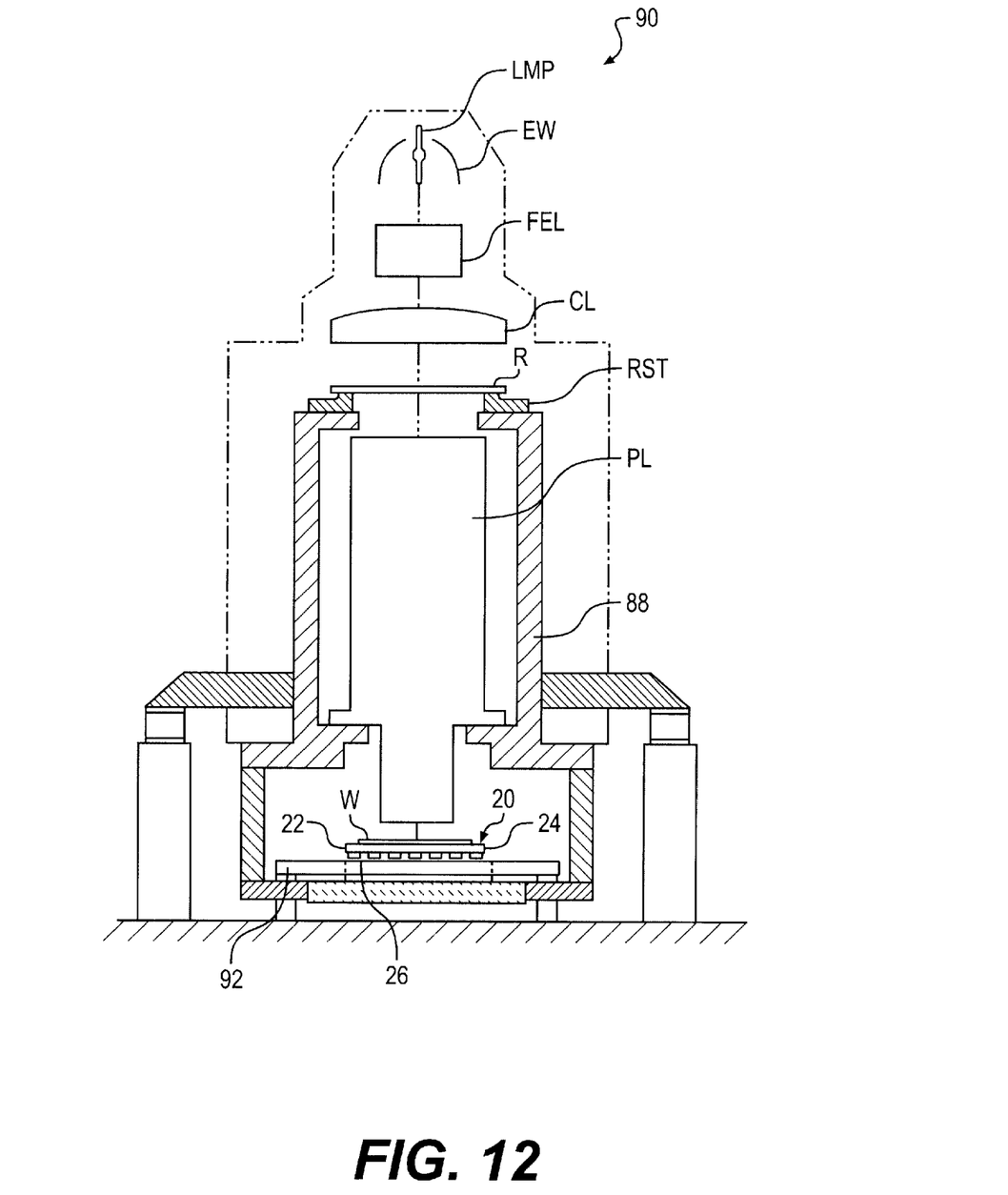
FIG. 12 is a schematic of an exposure apparatus using the electric motor of FIG. 1.

FIG. 12 schematically illustrates an example of an exposure apparatus, generally indicated at 90, using the planar motor 20 of the present invention. The exposure apparatus generally comprises a frame 88, an optical system, the motor 20, and the stage 22 for supporting and positioning a wafer W. The optical system is mounted on the frame 88 above a base 92. The base 92 is shown connected to the frame 88, however, it may also be attached to a separate frame. The coil array 26 is mounted on an upper surface of the base 92. The magnet array 24 is connected to a lower surface of the stage 22 and is movable relative to the coil array 26 and the optical system. The optical system projects light through a mask pattern (e.g., circuit pattern for a semiconductor device) formed in a reticle R which is supported and scanned using a reticle stage RST. The optical system includes an illuminator having a lamp LMP and an ellipsoid mirror EM surrounding the lamp. The illuminator comprises an optical integrator FEL for producing secondary light source images and a condenser lens CL for illuminating the reticle R with uniformed light flux. A projection lens PL focuses the light onto the wafer W. The wafer W is positioned under the projection lens PL and preferably held by vacuum suction on a wafer holder (not shown) which is supported by the wafer stage 22. In operation, light beams from the illuminator pass through the reticle R and expose photoresist on the wafer W, which is supported and scanned using the stage 22 driven by the motor 20. Further details of the components of the exposure apparatus 90 may be referenced from U.S. Pat. No. 5,528,118, by M. Lee, for example. It is to be understood that the present invention is not limited to the exposure apparatus 90 described herein or to exposure systems for wafer processing. The general reference to the exposure apparatus 90 is purely for illustrating an embodiment of an environment in which the invention may be used.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

In addition, the photolithography system according to the present embodiment is also applicable to a scanning type photolithography system (such as one disclosed in U.S. Pat. No. 5,473,410, for example), which exposes a mask pattern by moving a mask and a substrate synchronously. Further, the present invention is also applicable, as the photolithography system according to the present embodiment, to a step-and-repeat type photolithography system that exposes a mask pattern while a mask and a substrate are stationary and moves the substrate in step in succession. U.S. Pat. No. 5,473,410 is hereby incorporated by reference thereto, in its entirety.

Still further, the present invention is also applicable, as the photolithography system according to the present embodiment, to a proximity photolithography system that exposes a mask pattern by closely locating a mask and a substrate without the use of a projection optical system.

The use of a photolithography system need not be limited to use in semiconductor manufacturing, but can be more widely applied. For example, the present invention can be applied in an LCD photolithography system which exposes a liquid crystal display device pattern onto a rectangular glass plate and a photolithography system for manufacturing a thin film magnetic head.

In terms of a light source used for the photolithography system according to the present invention, not only the g-line (436 nm), i-line (365 nm), KrF excimer laser (248 nm), ArF excimer laser (193 nm) and F2 laser (157 nm) can be used as sources, but also charged particle beams, such as the x-ray and electron beam can be used. For instance, in the case where an electron beam is used, thermionic emission type lanthanum hexaboride (LaB6) or tantalum (Ta) can be used as an electron gun. Furthermore, in the case where an electron beam is used, the structure could be such that either a mask is used or a pattern can be directly formed on a substrate without the use of a mask.

With regard to the magnification of the projection optical system, this need not be limited to a reduction system, since a 1x or a magnification system could be used as well. Also, when using far ultra-violet rays such as, for example, in the excimer laser, with the projection optical system, glass materials such as quartz and fluorite that transmit far ultra-violet rays should be used. When the F2 laser or the x-ray is used, the optical system should be either catadioptric or refractive (a reticle should also be a reflective type). When an electron beam is used, electron optics should consist of electron lenses and deflectors. Needless to say, the optical path for electron beams should be in a vacuum.

When linear motors (see, for example, U.S. Pat. No. 5,623,853 or U.S. Pat. No. 5,528,118) are used in a wafer stage or a reticle stage, they could be either an air levitation type employing air bearings or a magnetic levitation type using Lorentz force or reactance force. In addition, a stage could move along a guide, or it could be a guideless type which uses no guide. U.S. Pat. Nos. 5,623,853 and 5,528,118 are hereby incorporated by reference thereto, in their entireties.

Reaction force generated by a wafer stage motion can be mechanically released to the floor (ground) by using a frame member, as described in JP Hei 8-166475 published patent (U.S. Pat. No. 5,528,118) U.S. Pat. No. 5,528,118 is hereby incorporated by reference thereto, in its entirety.

Reaction force generated by a reticle stage motion can be mechanically released to the floor (ground) by using a frame member, as described in JP Hei 8-330224 published patent (U.S. application Ser. No. 08/416,658). U.S. application Ser. No. 08/416,658 is hereby incorporated by reference thereto, in its entirety.

As described above, the photolithography system according to the embodiment(s) of the present application can be built by assembling various subsystems, including each element listed in the claims of the present application, in such manner that prescribed mechanical accuracy, electrical accuracy and optical accuracy are maintained. In order to maintain various accuracy, prior to and following assembly every optical system is adjusted to achieve its optical accuracy, every mechanical system is adjusted to achieve its mechanical accuracy and every electrical system is adjusted to achieve its electrical accuracy before and after its assembly. The process of assembling each subsystem into a photolithography system includes mechanical interface, electrical circuits' wiring connections and air pressure plumbing connections between each subsystem. It is needless to say that there is a process where each subsystem is assembled prior to assembling a photolithography system from various subsystems. Once a photolithography system is assembled with various subsystems, total adjustment is performed to make sure that every accuracy is maintained in the total photolithography system. Incidentally, it is desirable to manufacture an exposure system in a clean room where the temperature and the cleanliness are controlled.

Figure 13:
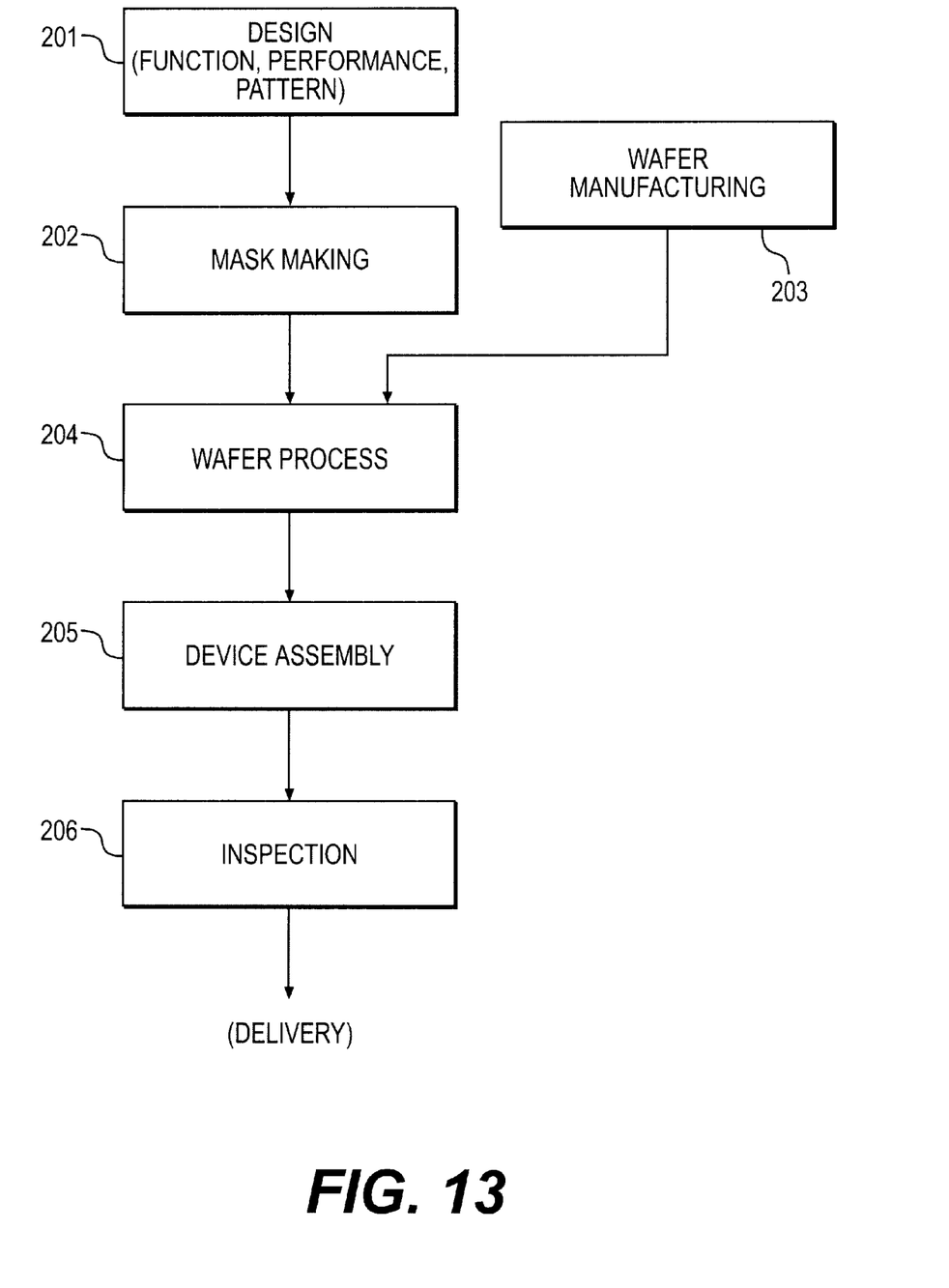
FIG. 13 is a flowchart outlining a process of manufacturing semiconductor devices according to the present invention.

Semiconductor devices are fabricated by going through the following steps as shown in FIG. 13: in step 201 a device's function and performance are designed; in step 202 a mask (reticle) is designed according to the previous designing step; in step 203 a wafer is made from a silicon material; in step 204 the reticle pattern is exposed on a wafer by the photolithography system in the aforementioned embodiment(s); in step 205 the device is assembled (including the dicing process, bonding process and packaging process); and, in step 206 the device is inspected. After successfully passing inspection, the device is delivered to the appropriate customer.

What is claimed is:

1. A planar electric motor comprising:

a magnet array generating magnetic fields of alternating polarity; and a coil array positioned adjacent to the magnet array and operable to interact with said magnetic fields to generate an electromagnetic force between the coil array and the magnet array, the coil array comprising a first coil array having a plurality of coils having a first shape and extending longitudinally in a first direction, and a second coil array having a plurality of coils having a second shape different from said first shape and extending longitudinally in a second direction generally orthogonal to said first direction, wherein individual coil of the plurality of coils having the second shape has a length greater than the stroke of the motor in the second direction.

2. The electric motor of claim 1, wherein the first shape is a polygonal shape and the second shape is an oval shape and each of the oval shaped coils of the second coil array has a length greater than a length of the polygonal shaped coils of the first coil array.

3. The electric motor of claim 2, wherein a ratio of the length of the oval shaped coils to the length of the polygonal shaped coils is at least about 2.

4. The electric motor of claim 1, wherein the first coil array includes a plurality of polygonal shaped coils, and the second coil array includes a plurality of oval shaped coils.

5. The electric motor of claim 4, wherein each of said plurality of oval shaped coils is substantially flat with generally planar upper and lower surfaces.

6. The electric motor of claim 4, wherein the oval shaped coils are stacked in a laterally partially overlapping arrangement to form a row of coils.

7. The electric motor of claim 4, wherein said polygonal shape is hexagonal.

8. The electric motor of claim 4, wherein the polygonal shaped coils are arranged in a laterally abutting configuration to form a row of polygonal shaped coils.

9. The electric motor of claim 4, wherein the polygonal shaped coils are arranged in a laterally partially overlapping configuration to form a row of polygonal shaped coils.

10. The electric motor of claim 4, wherein said plurality of oval shaped coils comprises less coils than said plurality of polygonal shaped coils.

11. The electric motor of claim 4, wherein one of the magnet array and the coil array is operable to move in six degrees of freedom relative to the other of the magnet array and the coil array.

12. The electric motor of claim 4, wherein said magnetic fields alternate in adjacent rows and columns of the magnet array.

13. The electric motor of claim 4, wherein said magnet array comprises a plurality of magnets.

14. The electric motor of claim 13, wherein each of said plurality of magnets is rectangular in cross-sectional shape.

15. The electric motor of claim 13, wherein each of said plurality of magnets is octagonal in cross-sectional shape.

16. The electric motor of claim 1, wherein one of the first coil array and the second coil array is stacked on the other of the first coil array and the second coil array.

17. An exposure apparatus comprising:
a frame;
an optical system for forming an image on an article, the optical system being mounted on the frame;
a base positioned below the optical system;
a stage positioned adjacent to the base and configured for supporting the article, the stage being movable relative to the base and the optical system; and
an electric motor operable to move the stage, the motor comprising a magnet array generating magnetic fields of alternating polarity, and a coil array positioned adjacent to the magnet array and operable to interact with said magnetic fields to generate an electromagnetic force between the coil array and the magnet array, the coil array comprising a first coil array having a plurality of coils having a first shape and extending longitudinally in a first direction, and a second coil array having a plurality of coils having a second shape different from the first shape and extending longitudinally in a second direction generally orthogonal to said first direction, one of the coil array and the magnet array being connected to the stage for movement therewith relative to the other of the magnet array and the coil array connected to the base,
wherein individual coil of the plurality of coils having the second shape has a length greater than the stroke of the motor in the second direction.

18. The exposure apparatus of claim 17, wherein the first shape is a polygonal shape and the second shape is an oval shape and each of the oval shaped coils of the second coil array has a length greater than a length of the polygonal shaped coils of the first coil array.

19. The exposure apparatus of claim 18, wherein a ratio of the length of the oval shaped coils to the length of the polygonal shaped coils is at least about 2.

20. The exposure apparatus of claim 17, wherein the first coil array includes a plurality of polygonal shaped coils, and the second coil array includes a plurality of oval shaped coils.

21. The exposure apparatus of claim 20, wherein each of said plurality of oval shaped coils is substantially flat with generally planar upper and lower surfaces.

22. The exposure apparatus of claim 20, wherein the oval shaped coils are stacked in a laterally partially overlapping arrangement to form a row of coils.

23. The exposure apparatus of claim 20, wherein the polygonal shaped coils are arranged in a laterally abutting configuration to form a row of polygonal shaped coils.

24. The exposure apparatus of claim 20, wherein said polygonal shape is hexagonal.

25. The exposure apparatus of claim 20, wherein said plurality of oval shaped coils comprises less coils than said plurality of polygonal shaped coils.

26. The exposure apparatus of claim 20, wherein one of the magnet array and the coil array is operable to move in six degrees of freedom relative to the other of the magnet array and the coil array.

27. The exposure apparatus of claim 20, wherein one of the first coil array and the second coil array is stacked on the other of the first coil array and the second coil array.

28. The exposure apparatus of claim 17, wherein the magnet array is connected to a lower surface of the stage for movement therewith and the coil array is connected to an upper surface of the base.

29. The exposure apparatus of claim 17, wherein said magnet array comprises a plurality of magnets.

30. A stage positioning system comprising:
a stage movable relative to a stationary base in a first direction, and a second direction generally orthogonal to the first direction; and
an electric motor operable to move the stage, the motor comprising a magnet array generating magnetic fields of alternating polarity, and a coil array positioned adjacent to the magnet array and operable to interact with said magnetic fields to generate an electromagnetic force between the coil array and the magnet array, the coil array comprising a first coil array having a plurality of coils extending longitudinally in the first direction, and a second coil array having a plurality of coils extending longitudinally in the second direction, individual coil of the first coil array having a length smaller than a length of the stage in the first direction and individual coil of the second coil array having a length greater than a length of the stage in the second direction, one of the coil array and the magnet array being connected to the stage for movement therewith relative to the other of the magnet array and the coil array.

31. The stage positioning system of claim 30, wherein the coils of the first coil array are polygonal shaped.

32. The stage positioning system of claim 30, wherein the coils of the second coil array are oval shaped.

33. The stage positioning system of claim 30, wherein the length of the coils of the first coil array is about one half the length of the stage in the first direction.

34. The stage positioning system of claim 30, wherein the length of the coils of the second coil array is greater than the length of the stage in the second direction plus the stroke of the motor in the second direction.

35. The stage positioning system of claim 30, wherein the coils of the second coil array are stacked in a laterally overlapping arrangement.

36. The stage positioning system of claim 30, wherein the magnet array is connected to the stage.

37. The stage positioning system of claim 30, wherein said magnet array comprises a plurality of magnets.

38. A stage positioning system comprising:
   a stage movable relative to a stationary base in a first direction, and a second direction generally orthogonal to the first direction; and
   an electric motor operable to move the stage, the motor comprising a magnet array generating magnetic fields of alternating polarity, and a coil array positioned adjacent to the magnet array and operable to interact with said magnetic fields to generate an electromagnetic force between the coil array and the magnet array, the coil array comprising a first coil array having a plurality of coils extending longitudinally in the first direction, and a second coil array having a plurality of coils extending longitudinally in the second direction, the length of the individual coil of the second coil array in the second direction being greater than the length of the individual coil of the first coil array in the first direction, one of the coil array and the magnet array being connected to the stage for movement therewith relative to the other of the magnet array and the coil array.

39. The stage positioning system of claim 38, wherein said magnet array comprises a plurality of magnets to generate said magnetic fields.

40. A device manufactured with the exposure apparatus of claim 17.

41. A wafer on which an image has been formed by the exposure apparatus of claim 17.

* * * * *